United States Patent [19]
Huh et al.

[11] Patent Number: 6,037,205
[45] Date of Patent: *Mar. 14, 2000

[54] METHOD OF FORMING CAPACITOR FOR SEMICONDUCTOR DEVICE USING $N_2O$ GAS

[75] Inventors: Yun Jun Huh; Sang Hyun Kim, both of Chungcheongbuk-Do; Je Uk Oh, Seoul, all of Rep. of Korea

[73] Assignee: LG Semicon Co., Ltd., Chungcheongbuk-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/839,825

[22] Filed: Apr. 18, 1997

[30] Foreign Application Priority Data

Oct. 24, 1996 [KR] Rep. of Korea ............... 96/48006

[51] Int. Cl.$^7$ .................................. H01L 21/70
[52] U.S. Cl. .................. 438/240; 438/239; 438/253; 438/287; 438/396
[58] Field of Search .................. 438/240, 396, 438/239, 253, 287; 257/310

[56] References Cited

U.S. PATENT DOCUMENTS

| | | | |
|---|---|---|---|
| 3,466,230 | 9/1969 | Carithers | 438/240 |
| 4,980,307 | 12/1990 | Ito et al. | 438/591 |
| 5,248,629 | 9/1993 | Muroyama | 438/240 |
| 5,254,505 | 10/1993 | Kamiyama | 438/240 |
| 5,352,623 | 10/1994 | Kamiyama | 438/396 |
| 5,443,993 | 8/1995 | Park et al. | 438/396 |
| 5,622,888 | 4/1997 | Sekine et al. | 438/398 |
| 5,641,702 | 6/1997 | Imai et al. | 438/240 |
| 5,699,291 | 12/1997 | Tsunemine | 365/149 |
| 5,726,083 | 3/1998 | Takaishi | 438/240 |
| 5,763,300 | 6/1998 | Park et al. | 438/240 |
| 5,786,248 | 7/1998 | Schuegraft | 438/240 |

OTHER PUBLICATIONS

Robert C. Weast "CRC Handbook of Chemistry and Physics", p., F90, Aug. 2, 1989.

S. C. Sun et al. " A New Post–Deposition Annealing Method Using Furnace N2O for the Reduction of Leakage Current of CVD Ta2O5 Storage Capacitors", IEEE, pp. (27. 4. 1)–(27. 4. 4), 1996.

S. C. Sun et al. " Leakage Current Reduction in Chemical–Vapor–Deposited Ta2O5 Films by Rapid Thermal Annealing in N2O", IEEE Elctron Device Letters, vol. 17, No. 17, pp. 355–357, Jul. 1996.

K. Naruke, S. Taguchi, and M. Wada, "Stress Induced Leakage Current Limiting to Scale Down EEPROM Tunnel Oxide Thickness", IEDM 1988, pp. 424–427.

G. W. Yoon, A. B. Joshi, J. Kim, and Dim Lee Kwong, "MOS Characteristics of $NH_3$—Nitrided $N_2O$—Grown Oxides", IEEE EDL 1993, vol. 14, pp. 179–181.

S. C. Sun and T. F. Chen, "A Novel Approach for Leakage Current Reduction of LPCVD $Ta_2O_5$ and $TiO_2$ Films by Rapid Thermal $N_2O$ Annealing", IEDM, 1994, pp. 333–338.

*Primary Examiner*—Carl Whitehead, Jr.
*Assistant Examiner*—Maria Guerrero
*Attorney, Agent, or Firm*—Morgan, Lewis & Bockius LLP

[57] ABSTRACT

A method of forming a capacitor for a semiconductor device includes the steps of forming a gate electrode on a semiconductor substrate, forming an impurity diffused region on portions of the semiconductor substrate at sides of the gate electrode, forming a storage node electrode layer contacting one side of the impurity diffused region, forming a thermal nitride film on the storage node electrode layer, forming a $Ta_2O_5$ layer on the thermal nitride film, and annealing the $Ta_2O_5$ layer using an $N_2O$ gas.

16 Claims, 8 Drawing Sheets

METHOD OF FORMING CAPACITOR FOR SEMICONDUCTOR DEVICE USING N₂O GAS

BACKGROUND OF THE INVENTION

1. Field of the Invention

The present invention relates to a method of forming a thin film for a semiconductor device, and more particularly, to a method of forming a thin film using an $N_2O$ gas for improving of characteristic of the thin film. Although the present invention has a wide range of applications, it is particularly suitable for use as a gate insulating film or a dielectric film of a capacitor.

2. Discussion of the Related Art

A thermal oxide film is generally used as a gate insulating film in a semiconductor device. However, as the pattern dimension of the semiconductor device becomes smaller and miniaturized, the thermal oxide file has several problems. For example, leakage current increases due to an electric field and interface state density increases, (see K. Naruke, S. Taguchi, and M. Wada IDEM 1988, pp 424).

To improve such problems, a method is provided for improving hot carrier characteristic and electric integrity in a gate oxide film using an oxide film including nitrogen. However, the characteristic of the gate oxide film varies depending on how the nitrogen is incorporated into the oxide film. In earlier used oxide film, a thermal oxide film was nitride treated or nitrated to an ammonia gas and the electron capture characteristics increased by adding $H_2$ into the oxide film. In addition, degradation of electron mobility occurred by an excessive nitrogen content (see T. Ito, T Nakamura, and H. Ishikawa, IEEE Trans. Electron Devices, 1982, ED-29, pp498).

An $N_2O$ oxide film, which has been studied since the late 1980's, has an excellent hot-carrier effect and an excellent electrical characteristic. However, since the nitrogen incorporated into the interface between the oxide film and the silicon has a small content of 1–2 Atomic %, it is not appropriate to use the nitrated oxide film as the interface layer of boron diffusion (see G. W. Yoon, A. B. Joshi, J. Kim, and D. L. Kwong; IEEE EDL 1993, Vol. 14, pp179).

A conventional method of forming the thin film (used as an insulating film or a dielectric film) of the semiconductor device will be described with reference to the accompanying drawings.

First, the method of forming the thin film used as the insulating film of the semiconductor device will be described referring to FIG. 1a and FIG. 1b which are sectional views showing process steps of a conventional gate insulating film.

The conventional insulating film, as shown in FIG. 1a and FIG. 1b, includes a silicon substrate 1, an oxide film 2, and a thermal oxide film 3. The oxide film 2 on the silicon substrate 1 is removed through a furnace of high temperature in the ambient of $O_2$ or $H_2O$ before forming a gate electrode. Then, thermal oxide film 3 is grown. To incorporate the nitrogen into the interface between the silicon substrate and the thermal oxide film in the thermal oxidation process, either the $N_2O$ gas is used as an oxidation reaction material or the thermal oxide film is nitrated to $N_2O$ gas or $NH_3$ gas.

The formation of the thin film used as the dielectric film will be described below with respect to a DRAM.

A DRAM generally includes a stack capacitor and a trench capacitor. The stack capacitor includes a fin structure, a cylinder structure, and a box structure. The cylinder structure is generally used taking the capacitance into consideration.

For high capacitance, it is suggested that a contact area of a storage node electrode and a plate electrode made large in a limited cell area and that a dielectric film be formed of a material having a high dielectric ratio. A $Ta_2O_5$ thin film, which is often used in the capacitor of the DRAM due to its high dielectric ratio, has a large leakage current at As deposition. For such a reason, it is not suitable for a dielectric material of the capacitor in a highly integrated device such as 256M DRAM. Therefore, an appropriate annealing is required to reduce the leakage current.

At present, it is regarded that $N_2O$ annealing is more effective than $O_2$ annealing using a high temperature furnace and rapid thermal oxidation(RTO) for reducing the leakage current. It is reported that optimal condition of rapid thermal annealing(RTA) using the $N_2O$ gas can be achieved by annealing for 60 seconds at a temperature of 800° C. (see S. C. Sun and T. F. Chen IDEM 94-333, 1994).

The formation of the dielectric film in the DRAM capacitor having the widely used cylinder structure will now be described below with reference to FIGS. 2a–2d which are sectional views of process steps showing a dielectric film in a capacitor according to the prior art.

As shown in FIG. 2a, a field oxide film 11 (for device isolation), impurity diffused regions 12, gate electrodes 13, bit lines 14, and insulating films 15a, 15b, 15c, and 15d are formed on a semiconductor substrate 10. A storage node electrode 16 contacts one side of the impurity diffused regions 12 on the semiconductor substrate 10. The insulating films 15a, 15b, 15c, and 15d insulate and flatten respective layers and are used as end point in an etching process. The storage node electrode 16 includes a polysilicon.

Subsequently, as shown in FIG. 2b, the surface of the storage node electrode 16 is treated by rapid thermal nitridation(RTN) using $NH_3$ gas.

As shown in FIG. 2c, $Ta_2O_5$ having a high dielectric ratio is deposited on the entire surface of the RTN treated storage node electrode 16 by chemical vapor deposition(CVD) so as to form a dielectric film 17. The dielectric film 17 is then treated by RTN at a temperature of 800° C. with a pressure of 760 Torr for 60 seconds using the $N_2O$ gas.

As shown in FIG. 2d, a plate electrode 18 is formed by depositing TIN or the like.

As aforementioned, the electrical characteristic of the thin film used as an insulating film or a dielectric film can be improved by the method for forming the thin film using $N_2O$ gas. However, although the conventional method for forming the thin film enables electrical characteristic to be improved to a certain extent, it has several problems in its application as the pattern dimension site decreases. First, the problems caused by using the thin film as an insulating film will be described.

In case of using a pure thermal oxide film or a oxide film including nitrogen as the gate insulating film, the pattern dimension is reduced. As a result, the gate insulating film becomes thinner. If the thickness of the gate insulating film becomes 50 Å or lower, direct tunneling occurs instead of F-N tunneling in the tunneling characteristic of the electron. The direct tunneling causes the characteristic of the gate insulating film to deteriorate and thus, becomes unsuitable for a device.

In addition, the conventional gate insulating film has a disadvantage, that its insulating characteristic deteriorates by implanting ion such as boron during forming of $p^+$ poly gate over the gate insulating film in a later process.

The problems caused by using the thin film as a dielectric film will be described.

$Ta_2O_5$ dielectric film treated by RTA for 60 seconds at the temperature of 800° C. in the atmospheric pressure has more excellent leakage current characteristic than the dielectric film treated by RTO annealing or $O_2$ annealing in a high temperature furnace. However, it has a problem in that the effective thickness of the dielectric film becomes larger. For this reason, the film is difficult to use despite its improved leakage current characteristic.

SUMMARY OF THE INVENTION

Accordingly, the present invention is directed to a method for forming a thin film using an $N_2O$ gas that substantially obviates one or more of the problems due to limitations and disadvantages of the related art.

An object of the present invention is to provide a method for forming a thin film using an $N_2O$ gas in which insulating and dielectric characteristics of the thin film can be improved by varying process condition and nitrogen contents of respective layers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming a thin film for a gate insulating film using a $N_2O$ gas according to the present invention includes the steps of: forming a nitride film on a semiconductor by an annealing process; and oxidizing the nitride film by annealing using the $N_2O$ gas.

In another aspect of the present invention, a method for forming a thin film for a dielectric film using a $N_2O$ gas includes the steps of: forming a gate electrode on a semiconductor substrate and forming an impurity diffused region on the surface of the substrate at both sides of the gate electrode; forming a storage node electrode layer contacting one side of the impurity diffused region; forming a thermal nitride film on the storage node electrode layer and forming a $Ta_2O_5$ layer on the thermal nitride film; and annealing the $Ta_2O_5$ layer using the $N_2O$ gas at a pressure of 1–100 Torr.

In another aspect of the present invention, a method of forming a thin film comprises the steps of forming a nitride film on a semiconductor layer by an annealing process; and oxidizing the nitride film through the annealing process using an $N_2O$ gas to form an oxidized nitride film and insulating the semiconductor layer from a conductive layer subsequently formed.

In another aspect of the present invention, a method of forming a thin film comprises the steps of forming a gate electrode on a semiconductor substrate; forming an impurity diffused region on portions of the semiconductor substrate at sides of the gate electrode; forming a storage node electrode layer contacting one side of the impurity diffused region; forming a thermal nitride film on the storage node electrode layer; forming a $Ta_2O$, layer on the thermal nitride film; and annealing the $Ta_2O$, layer using an $N_2O$ gas.

In a further aspect of the present invention, a method of forming a thin film comprises the steps of forming a gate electrode on a semiconductor substrate; forming a field oxide film on a first portion of the semiconductor substrate; forming impurity diffused regions on portions other than the first portion of the semiconductor substrate at sides of the gate electrode; forming an insulation film having a hole over one of the impurity diffused regions; forming a storage node electrode layer contacting the one of the impurity diffused regions through the hole; forming a thermal nitride film on the storage node electrode layer; forming a $Ta_2O_5$ layer on the thermal nitride film; and annealing the $Ta_2O_5$ layer using an $N_2O$ gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In the method for forming a thin film using an $N_2O$ gas according to the present invention, a gate insulating film which incorporates nitrogen of a certain amount is formed not by nitrating an oxide film but by oxidizing a nitride film.

The thin film according to the first embodiment of the present invention is used as the gate insulating film.

Figure 1A:
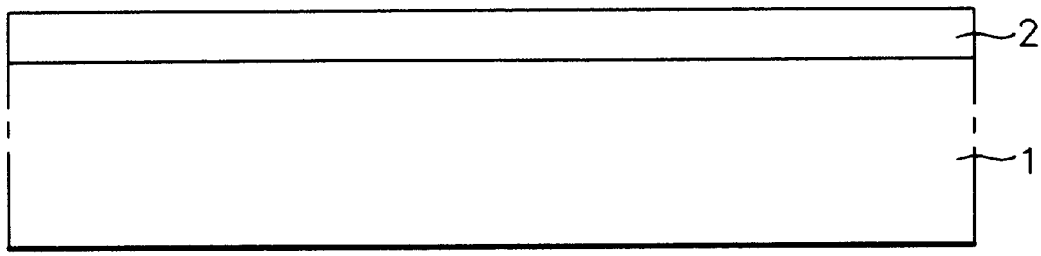
FIG. 1a and FIG. 1b are sectional views of process steps for forming a gate insulating film according to the prior art.
Figure 1B:
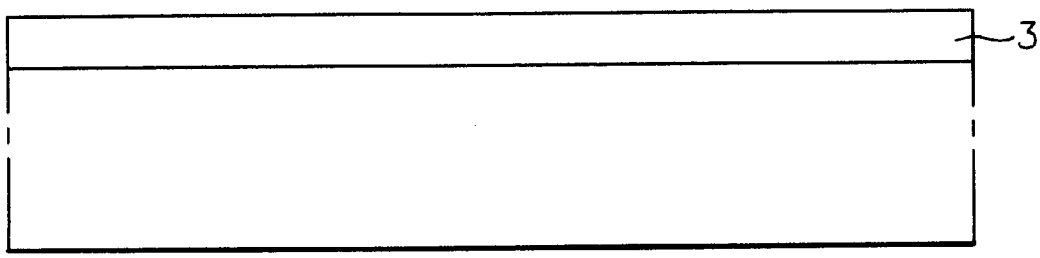
Figure 2A:
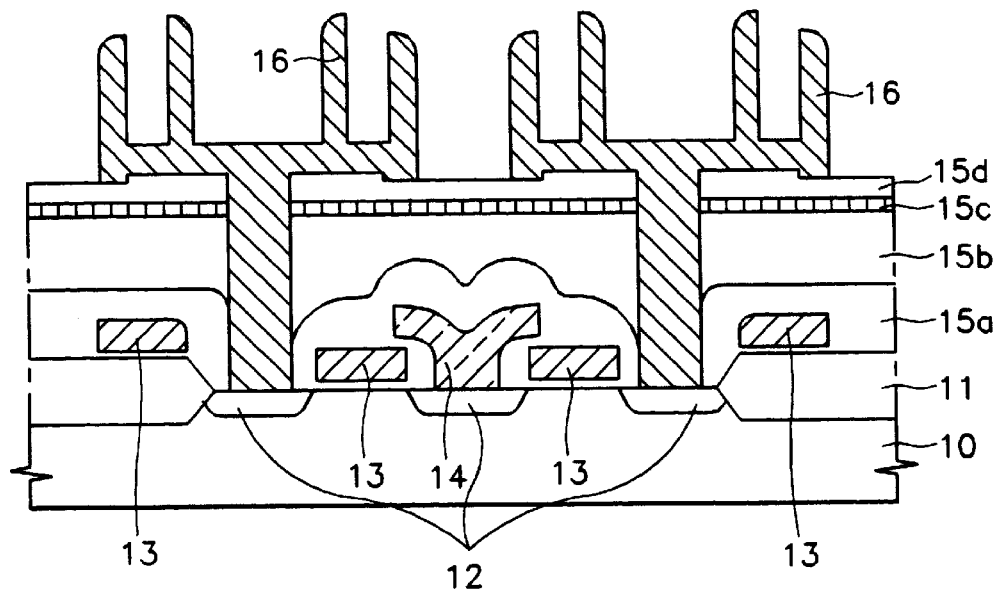
FIG. 2a to FIG. 2d are sectional views of process steps for forming a dielectric film of a capacitor according to the prior art.
Figure 2B:
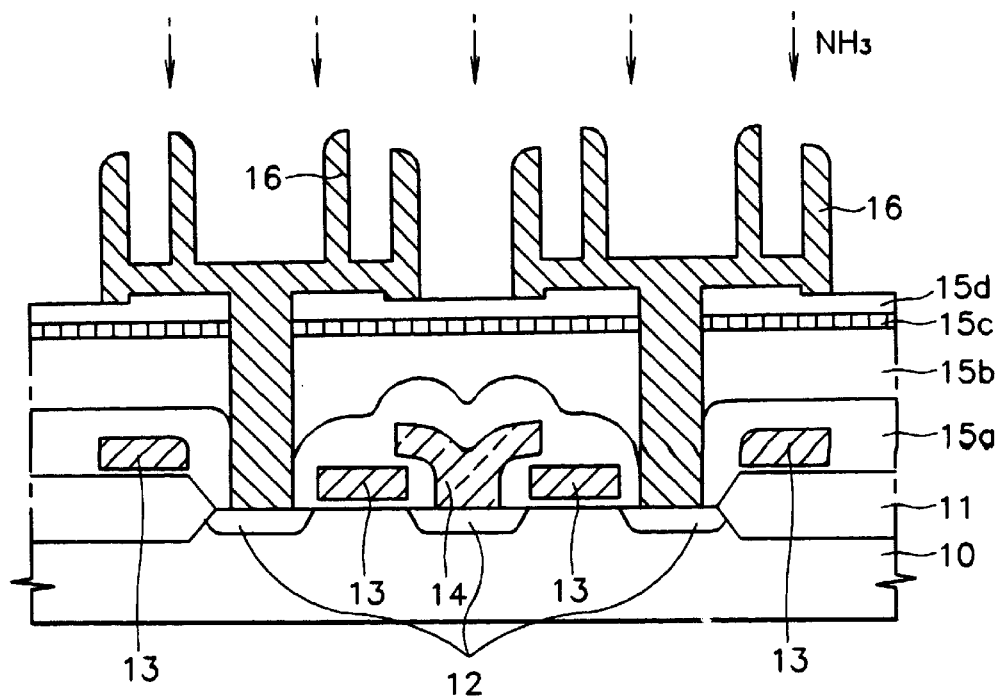
Figure 2C:
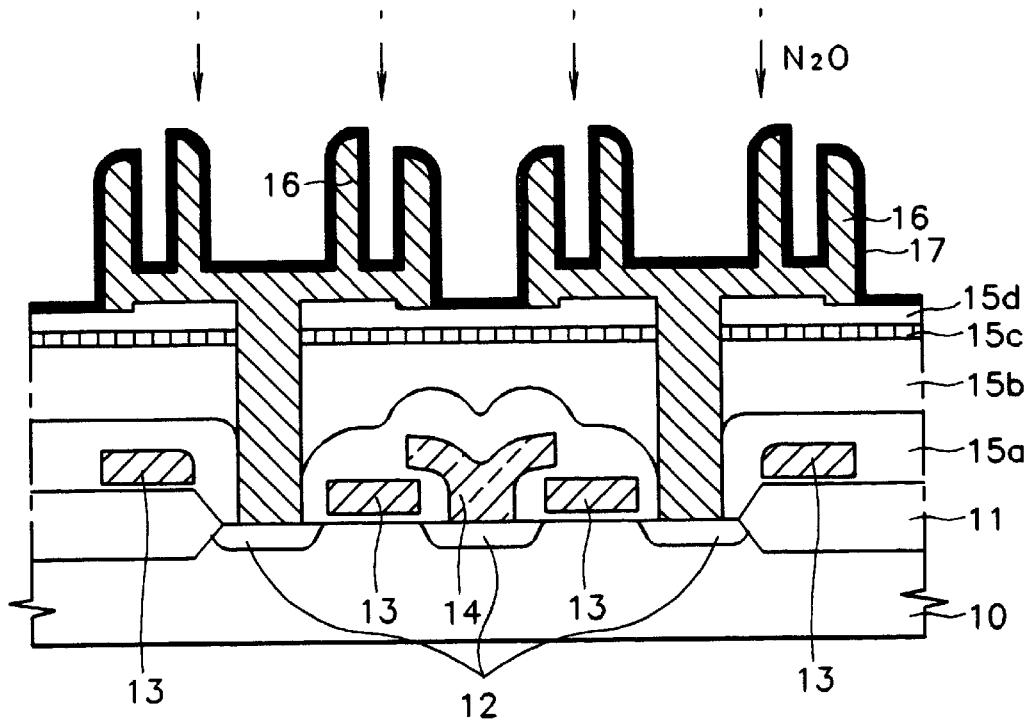
Figure 2D:
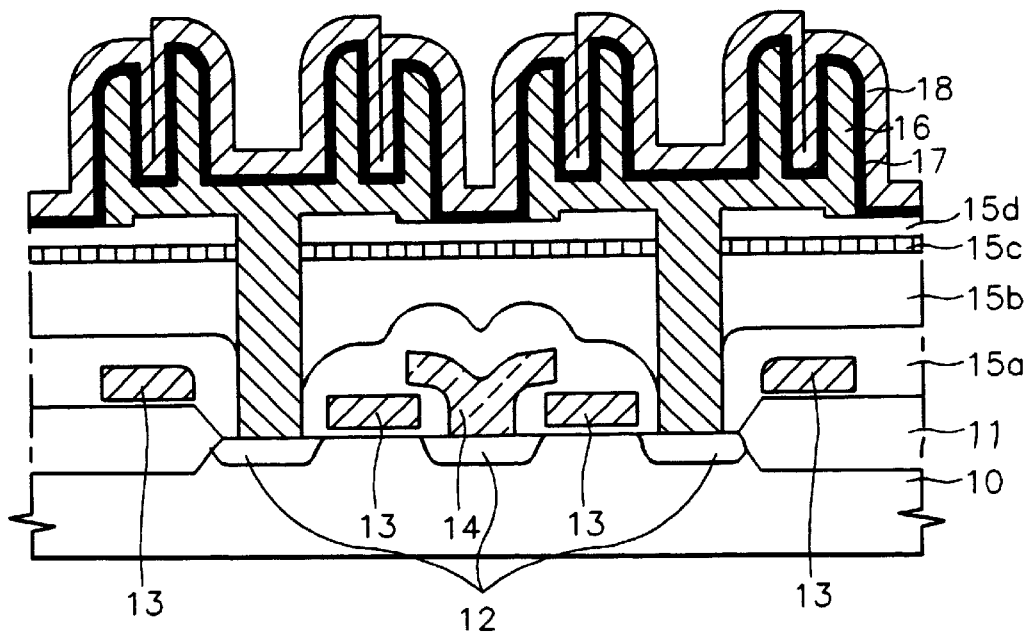
Figure 3A:
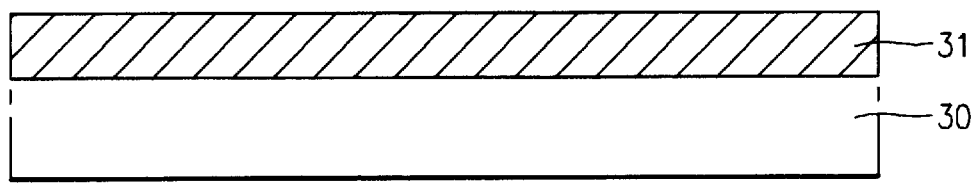
FIG. 3a to FIG. 3d are sectional views of process steps for forming a gate insulating film according to the first embodiment of the present invention.

As shown in FIG. 3a, an oxide film 31 is formed on a semiconductor substrate 30 and then removed. The (earlier formed) oxide film 31 is spontaneously formed when the semiconductor substrate 30 is exposed to air. Since the oxide film 31 is not a pure oxide film, it can be used as an insulating film.

Figure 3B:
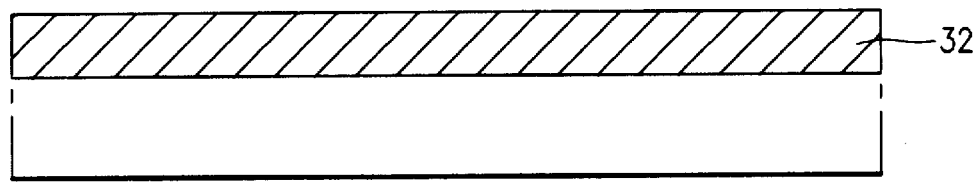

Subsequently, as shown in FIG. 3b, a nitride film 32 having a thickness of about 10–50 Å is formed on the semiconductor substrate 30 (the earlier oxide film having been removed) by thermal treatment at a temperature of about 800–1000° C. using an ammonia gas.

Figure 3C:
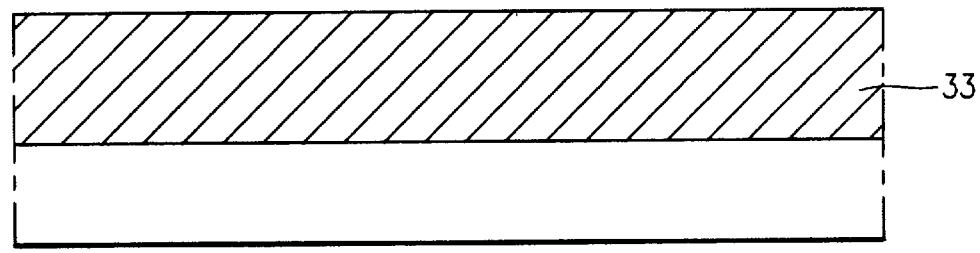
Figure 3D:
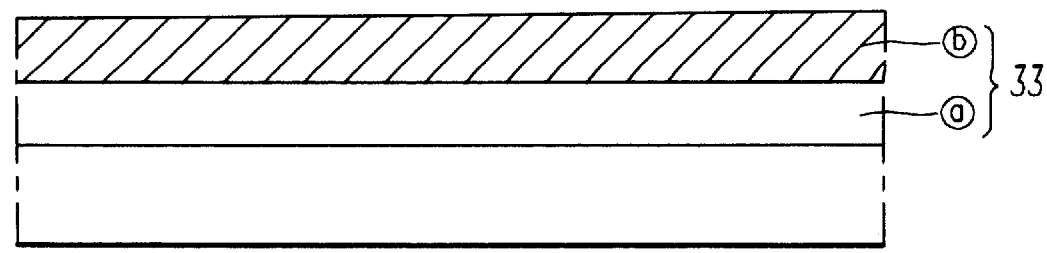

As shown in FIG. 3c, an oxidized nitride film 33 is formed by oxidizing the nitride film 32 using the $N_2O$ gas at a temperature of about 900–1100° C. and a pressure of about 50 Torr or above as shown in FIG. 3d. The oxidized nitride film 33 includes a lower layer (a) having nitrogen of a small content or low density and an upper layer (b) having nitrogen of a large content or high density.

The process steps of forming the gate insulating film with improved electrical characteristics according to the second embodiment of the present invention will be described below.

Figure 4A:
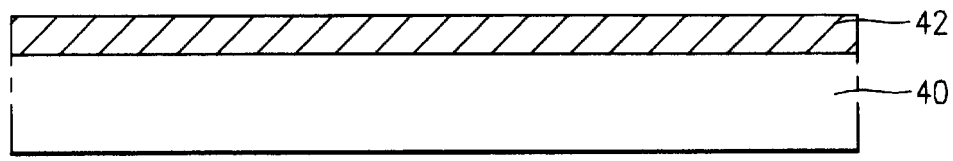
FIG. 4a to FIG. 4d are sectional views of process steps for forming a gate insulating film according to the second embodiment of the present invention.
Figure 4B:
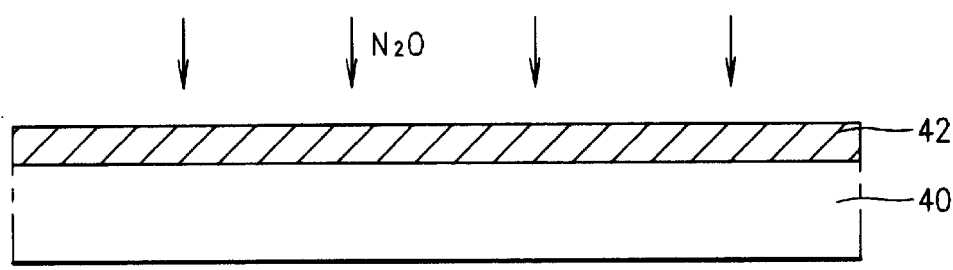
Figure 4C:
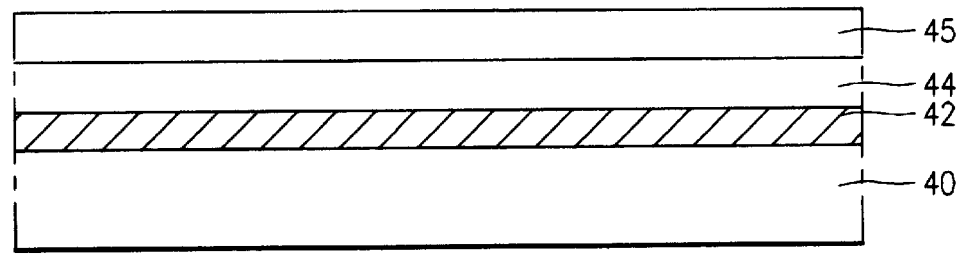

As shown in FIG. 3a, an oxide film 31 is formed on the semiconductor substrate 30 and then is removed. A nitride film 42 of about 10–30 Å is then formed on the semiconductor substrate 40 using an ammonia gas. The nitride film 42 is oxidized using an $N_2O$ gas as shown in FIG. 4b. Subsequently, as shown in FIG. 4c, a $Ta_2O_5$ layer 44 is formed on the oxidized nitride film 42 and a polysilicon layer 45 is formed on the $Ta_2O_5$ layer 44.

Figure 4D:
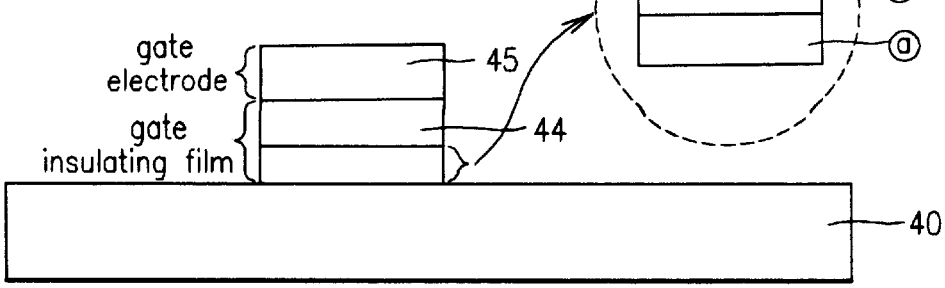

As shown in FIG. 4d, the oxidized nitride film 32, the $Ta_2O_5$ layer 44, and the polysilicon layer 45 are selectively etched to form a gate electrode. The oxidized nitride film 42 has a lower layer (a) having nitrogen of low concentration and an upper layer (b) having nitrogen of high concentration.

The thin film according to the first and second embodiments of the present invention, as aforementioned, solves problems such as leakage current so that the electrical characteristics of the device can be improved when using the thin film as a gate insulating film.

Figure 5A:
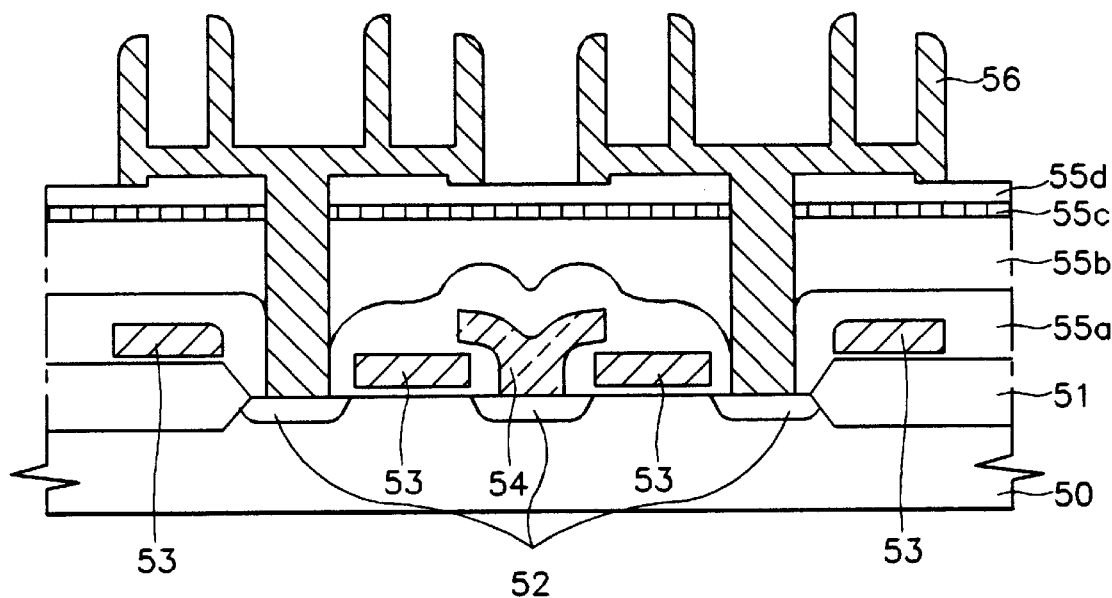
FIG. 5a to FIG. 5d are sectional views of process steps for forming a dielectric film according to the third embodiment of the present invention.

A method for forming a thin film for use as a dielectric film of a capacitor will be described below with reference to FIGS. 5a–5d and FIG. 6. FIG. 5a to 5d are sectional views of process steps for forming a dielectric film according to the third embodiment of the present invention. FIG. 6 is a graph showing a characteristic of a dielectric film according to the third embodiment of the present invention.

In the third embodiment of the present invention, the thin film formed using an $N_2O$ gas is used as a dielectric film of the capacitor. Annealing is performed at a pressure lower than atmospheric pressure using the $N_2O$ gas to improve electrical characteristics.

The process steps of forming the dielectric film of the capacitor according to the third embodiment of the present invention will be described with reference to FIG. 5a to FIG. 5d. As shown in FIG. 5a, a field oxide film 51 (for device isolation), impurity diffused regions 52, gate electrodes 53, bit lines 54, and insulating films 55a, 55b, 55c and 55d are formed on the semiconductor substrate 50. A storage node electrode 56 contacts one side of the impurity diffused regions 52 on the semiconductor substrate 50. The insulating films insulate and flatten respective layers and are used as an end point in an etching process. The storage node electrode 56 includes polysilicon.

Figure 5B:
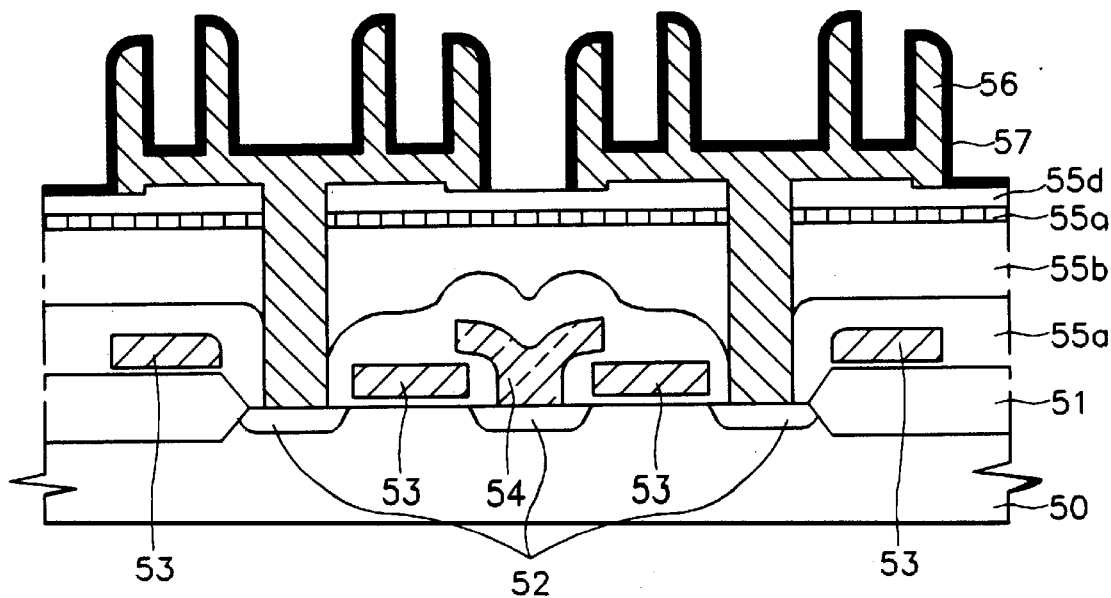
Figure 5C:
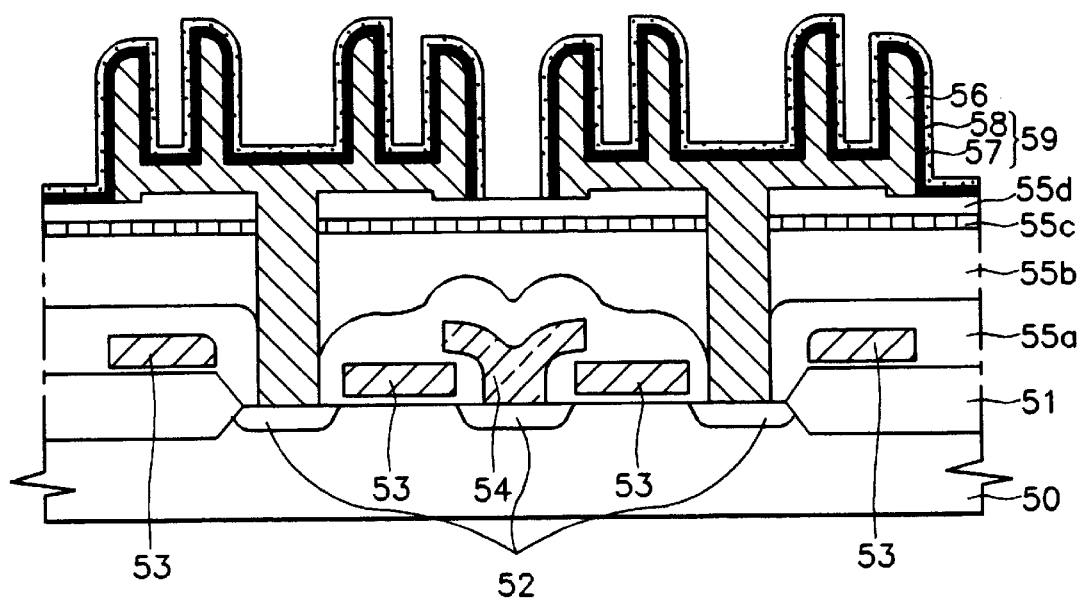
Figure 6:
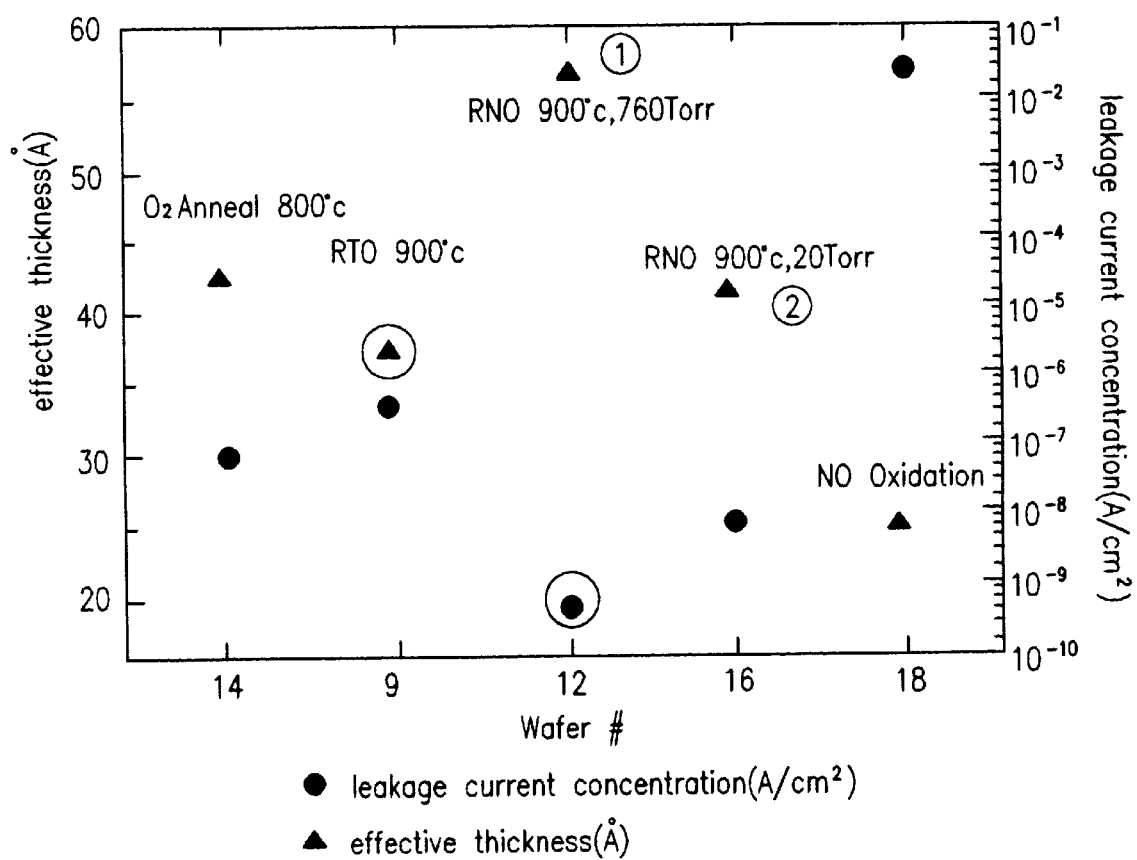
FIG. 6 is a graph showing a characteristic of a dielectric film according to the third embodiment of the present invention.

As shown in FIG. 5b, the surface of the storage node electrode 56 is treated by RTN using an $NH_3$ gas to form a nitride film 37. As shown in FIG. 5c, a $Ta_2O_5$ layer 58 having a high dielectric ratio is deposited on the RTN treated storage node electrode 56 by CVD to form a dielectric film 59 including the nitride film 57 and the $Ta_2O_5$ layer 58.

Figure 5D:
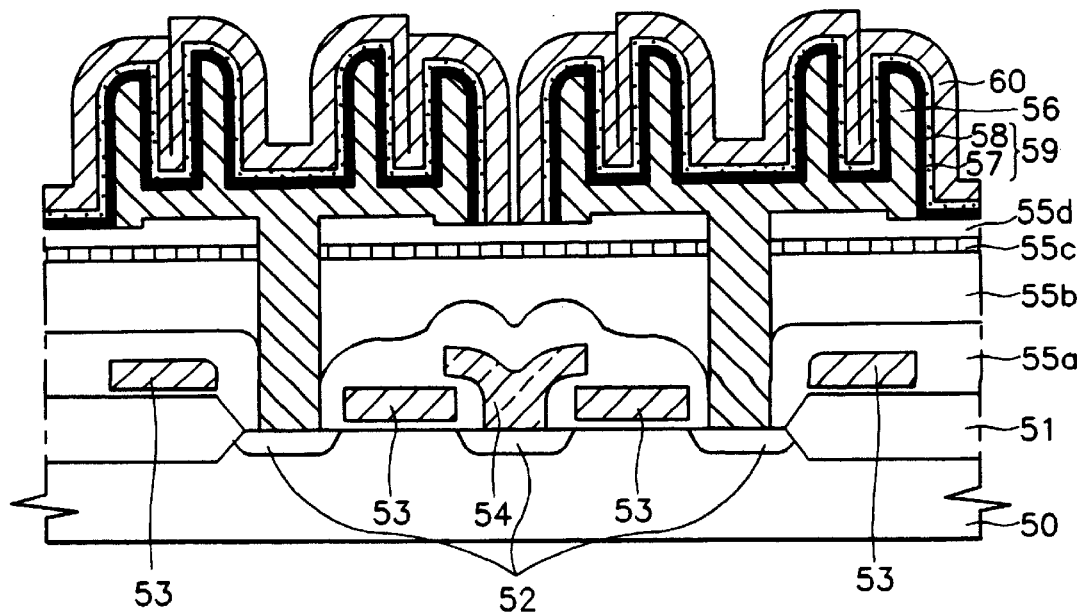

As shown in FIG. 5d, the dielectric film 59 is treated by RTA using the $N_2O$ gas at a temperature of about 800–900° C. and a pressure of about 1 Torr–100 Torr. A plate electrode 60 is then formed by depositing TIN or the like.

The dielectric film of the capacitor according to the third embodiment of the present invention, as aforementioned, has electrical characteristics as shown in FIG. 6, which shows effective thickness of the dielectric film and leakage current measured by a dot mask pattern.

In FIG. 6, wafer A shows values of leakage current concentration and effective thickness of the dielectric film formed by an annealing process at a temperature of 800° C. using the $O_2$ gas according to the conventional art. Wafer B shows values of leakage current concentration and effective thickness of the dielectric film formed by a rapid thermal oxidation process (RTO) at a temperature of 900° C. according to the conventional art. Wafer C shows values of leakage current concentration and effective thickness of the dielectric film formed by a rapid thermal annealing process (RNO) at a temperature of 900° C. using the $N_2O$ gas at an atmospheric pressure (760 Torr) according to the conventional art. Wafer D shows values of leakage current concentration and effective thickness of the dielectric film formed by a rapid thermal annealing process (RNO) at a preferable temperature of 900° C. and a preferable pressure of 20 Torr using the $N_2O$ gas according to the present invention. In case of wafer C, the leakage current considerably reduces to $10^{-9} A/cm^2$ or less as compared to $O_2$ annealing process or RTO annealing process. However, the effective thickness of the dielectric film is too high at greater than 50 Å for use in a highly integrated DRAM device. In case of wafer D of the present invention, the leakage current increases a small amount to $10^{-8} A/cm^2$ while the effective thickness is considerably reduced to about 40 Å.

The thin film used as a gate insulating film or a dielectric film using the $N_2O$ gas according to the present invention has the following advantages.

First, the nitride film formed by an ammonia gas is treated by RTO in the gate insulating film according to the first and second embodiments of the present invention. Thus, it is possible to extract $H_2$ included in the nitride film, so that the electrons captured can be reduced.

Second, the $N_2O$ oxide film is formed on the substrate and the oxide film by oxidizing the nitride film. At the interface between the oxide film and the electrode material, an oxide film having nitrogen of high density due to an ammonia nitride film is formed. Thus, the gate insulating film sufficiently acts as an interface layer of boron diffusion, for example.

Moreover, by improving the electrical characteristics including leakage current, it is possible to produce a very thin dielectric film while maintaining its effectiveness so that it is suitable for a capacitor in a highly integrated DRAM device.

It will be apparent to those skilled in the art that various modifications and variations can be made in the method for forming a thin film of the present invention without departing from the spirit or scope of the invention. Thus, it is intended that the present invention cover the modifications and variations of the invention provided they come within the scope of the appended claims and their equivalents.

What is claimed is:

1. A method of forming a capacitor for a semiconductor device on a semiconductor substrate, the method comprising the steps of:

forming an oxidized nitride layer on the semiconductor substrate, wherein the oxidized nitride layer includes a first layer and a second layer on the first layer, the second layer having a nitrogen concentration higher than the first layer;

forming a first $Ta_2O_5$ layer on the oxidized nitride layer:

forming a gate electrode on the first $Ta_2O_5$ layer;

forming an impurity diffused region on portions of the semiconductor substrate at sides of the gate electrode;

forming a storage node electrode layer contacting one side of the impurity diffused region;

forming a thermal nitride film on the storage node electrode layer;

forming a second $Ta_2O_5$ layer on the thermal nitride film; and annealing the second $Ta_2O_5$ layer using an $N_2O$ gas.

2. The method according to claim 1, wherein the second $Ta_2O_5$ layer is formed by chemical vapor deposition (CVD).

3. The method according to claim 1, wherein the step of annealing the second $Ta_2O_5$ layer is performed at a pressure of about 1–100 Torr.

4. The method according to claim 3, wherein the step of annealing the second $Ta_2O_5$ layer is performed at a temperature of about 800–900° C. for about 60 seconds.

5. A method of forming a capacitor for a semiconductor device on a semiconductor substrate, the method comprising the steps of:

forming an oxidized nitride layer on the semiconductor substrate, wherein the oxidized nitride layer includes a first layer and a second layer on the first layer, the second layer having a nitrogen concentration higher than the first layer;

forming a first $Ta_2O_5$ layer on the oxidized nitride layer;

forming a gate electrode on the first $Ta_2O_5$ layer;

forming a field oxide film on a first portion of the semiconductor substrate;

forming impurity diffused regions on portions other than the first portion of the semiconductor substrate at sides of the gate electrode;

forming an insulation film having a hole over one of the impurity diffused regions;

forming a storage node electrode layer contacting the one of the impurity diffused regions through the hole;

forming a thermal nitride film on the storage node electrode layer;

forming a second $Ta_2O_5$ layer on the thermal nitride film; and annealing the second $Ta_2O_5$ layer using an $N_2O$ gas.

6. The method according to claim 5, wherein the second $Ta_2O_5$ layer is formed by chemical vapor deposition (CVD).

7. The method according to claim 5, wherein the step of annealing the second $Ta_2O_5$ layer is performed at a pressure of about 1–100 Torr.

8. The method according to claim 7, wherein the step of annealing the second $Ta_2O_5$ layer is performed at a temperature of about 800–900 C. for about 60 seconds.

9. A method of forming a capacitor for a semiconductor device on a semiconductor substrate, the method comprising the steps of:

forming an oxidized nitride layer on the semiconductor substrate, wherein the oxidized nitride layer includes a first layer and a second layer on the first layer, the second layer having a nitrogen concentration higher than the first layer;

forming a first $Ta_2O_5$ layer on the oxidized nitride layer;

forming a gate electrode on the first $Ta_2O_5$ layer;

forming an impurity diffused region on portions of the semiconductor substrate at sides of the gate electrode;

forming first, second, third insulating layers on the gate electrode including the semiconductor substrate;

forming a storage node electrode layer contacting one side of the impurity diffused region;

forming a thermal nitride film on the storage node electrode layer;

forming a second $Ta_2O_5$ layer on the thermal nitride film; and annealing the second $Ta_2O_5$ layer using an $N_2O$ gas.

10. The method according to claim 9, wherein the second $Ta_2O_5$ layer is formed by chemical vapor deposition (CVD).

11. The method according to claim 9, wherein the step of annealing the second $Ta_2O_5$ layer is performed at a pressure of about 1–100 Torr.

12. The method according to claim 11, wherein the step of annealing the second $Ta_2O_5$ layer is performed at a temperature of about 800–900° C. for about 60 seconds.

13. A method of forming a capacitor for a semiconductor device on a semiconductor substrate, the method comprising the steps of:

forming an oxidized nitride layer on the semiconductor substrate, wherein the oxidized nitride layer includes a first layer and a second layer on the first layer, the second layer having a nitrogen concentration higher than the first layer;

forming a first $Ta_2O_5$ layer on the oxidized nitride layer, forming a gate electrode on the first $Ta_2O_5$ layer;

forming a field oxide film on a first portion of the semiconductor substrate;

forming impurity diffused regions on portions other than the first portion of the semiconductor substrate at sides of the gate electrode;

forming first, second, third insulating films on the gate electrode and the field oxide film including the semiconductor substrate; the first, second, third insulating layers having a hole over the impurity diffused regions;

forming a storage node electrode layer contacting the one of the impurity diffused regions through the hole;

forming a thermal nitride film on the storage node electrode layer;

forming a second $Ta_2O_5$ layer on the thermal nitride film; and annealing the second $Ta_2O_5$ layer using an $N_2O$ gas.

14. The method according to claim 13, wherein the second $Ta_2O_5$ layer is formed by chemical vapor deposition (CVD).

15. The method according to claim 13, wherein the step of annealing the second $Ta_2O_5$ layer is performed at a pressure of about 1–100 Torr.

16. The method according to claim 15, wherein the step of annealing the second $Ta_2O_5$ layer is performed at a temperature of about 800–900° C. for about 60 seconds.

* * * * *